United States Patent [19]
Lin

[11] Patent Number: 5,884,396
[45] Date of Patent: Mar. 23, 1999

[54] TRANSFER FLAT TYPE BALL GRID ARRAY METHOD FOR MANUFACTURING PACKAGING SUBSTRATE

[75] Inventor: Ting-hao Lin, Taoyuan Hsien, Taiwan

[73] Assignee: Compeq Manufacturing Company, Limited, Taoyuan Hsien, Taiwan

[21] Appl. No.: 846,857

[22] Filed: May 1, 1997

[51] Int. Cl.⁶ .................................................. H01R 43/00
[52] U.S. Cl. ........................... 29/827; 257/706; 257/707; 257/738; 438/102; 438/118
[58] Field of Search ............................... 29/825, 840, 832, 29/827; 257/706, 707, 738, 796; 438/118, 102

[56] References Cited

U.S. PATENT DOCUMENTS

| | | | |
|---|---|---|---|
| 5,409,865 | 4/1995 | Karnezos . | |
| 5,474,957 | 12/1995 | Urushima | 29/827 |
| 5,661,086 | 8/1997 | Nakashima et al. | 29/827 X |

OTHER PUBLICATIONS

Proc 45th Electronics Components & Technology Conf pp. 42–45 Article by J.W. Wilson et al, May 21–24, 1995.

*Primary Examiner*—Carl J. Arbes
*Attorney, Agent, or Firm*—Abelman, Frayne & Schwab

[57] ABSTRACT

The present invention relates to a TF-BGA method for manufacturing a packaging substrate, and includes steps of forming a single-sided circuit on a copper plate by electroplating, removing a layer of photoresist and sequentially laminating a dielectric layer and a metal plate on the copper plate, etching the copper plate, selectively applying a layer of solder resist, defining a cavity opening by punching, routing or etching, attaching a heat sink, forming dam rings and protecting the laminate by mold compound, attaching a die and bonding gold wires and encapsulating the cavity opening by encapsulate and attaching solder balls. In particular, a metal plate substitutes for a BT resin material to achieve low packaging cost and increasing the heat dissipating efficiency. A transfer flat type ball grid array method is employed to achieve an effect of fine circuitry and each single substrate is processed and tested individually. After the defective substrate units have been removed, the substrate units proved to be good are arranged in a long strip form and the borders thereof are molded to link in a latitudinal extension shape. A problem of the conventional entire strip of substrate set becoming useless when part of the substrate units are defective can be eliminated.

7 Claims, 4 Drawing Sheets

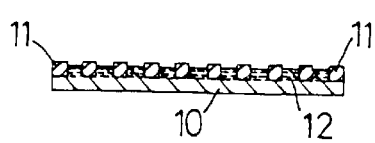 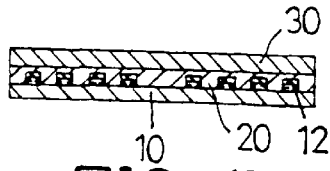 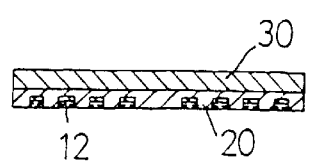
FIG. 1A  FIG. 1B  FIG. 1C
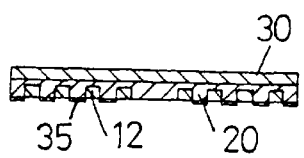 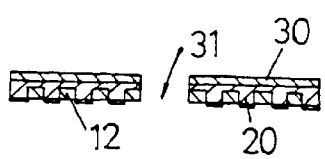 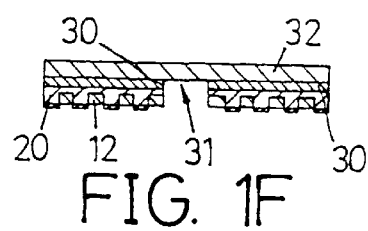
FIG. 1D  FIG. 1E  FIG. 1F
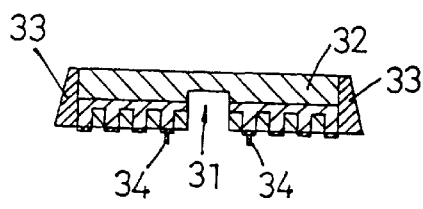 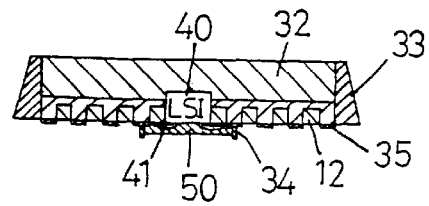
FIG. 1G  FIG. 1H
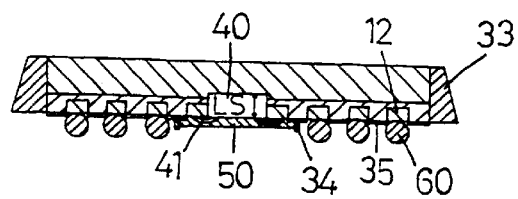
FIG. 1I … (page 1)

TRANSFER FLAT TYPE BALL GRID ARRAY METHOD FOR MANUFACTURING PACKAGING SUBSTRATE

BACKGROUND OF THE INVENTION

The present invention relates to a transfer flat type ball grid array (TF-BGA) method for manufacturing a packaging substrate, which is totally different from a conventional BGA method for manufacturing a packaging substrate. This method has advantages of: forming fine circuitry; improving electrical performance; reducing a waste material and therefore reducing the ultimate cost as well, reducing harm to the environment, improving the heat dissipation efficiency; and improving the yield due to salvaging some reusable substrate units from semi-scraped strip of substrate set.

A conventional BGA method for manufacturing a packaging substrate comprises sequential steps shown in FIG. 3A through FIG. 3H. First, FIG. 3A shows a step of drilling a double-sided laminate 70 with two layers of copper foils 71 on opposite sides thereof to form via holes 711. Next, FIG. 3B shows a step of plating the via holes 711 with copper 72 to form a connection between the two layers of copper foils 71. Then, FIG. 3C shows a step of applying a layer of etching resist (dry film) 73 on the copper foils 71 layers for forming circuit patterns. Subsequently, FIG. 3D shows a step of applying a layer of solder resist 75 on predetermined areas on both sides after the circuit patterns 74 having been formed on the laminate 70. Thereafter, FIG. 3E shows a step of filling up the via holes 711 with conductive paste 76 and attaching a die 77 thereon for performing functions of heat dissipation and die attachment. Then, FIGS. 3F, 3G and 3H sequentially proceed steps of bonding gold wires 78 between the die 77 and the circuit patterns 74, providing a mold tool for covering a bonding area with molding compound 79 and attaching solder balls 80 on ball pads defined by solder resist 75 through soldering.

Based on a conventional operating process, a plurality of packaging substrate units in a long strip form as shown in FIG. 2 for use in automatic machinery is produced through a commonly used packaging operation.

However, the packaging substrate units being made in a long strip form by using the conventional BGA method described above have several drawbacks which are as follows:

(1) Since the conventional BGA method adopts a double-sided circuit design, a complicate drilling step has to be taken and insufficient accuracy in via holes filling may create concern about reliability.

(2) The efficiency of heat dissipation through via holes is not effective and the step of filling up the via holes with conductive paste still has a potential reliability problem.

(3) In the conventional BGA method, since the die is attached on the conductive paste and covered by molding compound, a mold tool has to be provided for filling in the molding compound. Therefore, this assembly process lacks flexibility.

(4) The electrical performance is hard to improve since a grounding layer can not be easily added.

(5) A high-density circuitry is hard to achieve since via holes occupy some space in accordance with the drilling process.

(6) When one or two packaging substrate units in a long strip are scraped, the entire strip has to be scraped. This will lead to wasting material and lowering the yield, and doing harm to the environment.

In view of employing a double-sided circuit board and the conventional BGA method described above, there are several defects such as the complicated manufacturing, the electrical performance, etc., of the packaging process as well as a poor yield and poor usage of material due to the design in a long strip form, all of which have to be overcome.

SUMMARY OF THE INVENTION

It is a primary objective of the present invention to provide a TF-BGA method for manufacturing a packaging substrate to overcome the aforementioned shortcomings.

In accordance with an aspect of the invention, there is provided a TF-BGA method for manufacturing a packaging substrate, in which primarily forming a single-sided circuit to radically overcome all problems generated from filling via holes on a substrate. Since a heat sink (a metal plate) is attached on an upper surface of the substrate, the heat-transfer performance is significantly improved.

In accordance with another aspect of the invention, there is provided a TF-BGA method for manufacturing a packaging substrate, in which the way of forming a single-sided circuit is to apply a layer of photoresist to form a required circuit pattern to achieve the effects of high-density circuit and very fine circuit linewidth and space.

In accordance with still another aspect of the invention, there is provided a TF-BGA method for manufacturing a packaging substrate, in which the TF-BGA method comprises steps of electroplating a single-sided circuit on a copper plate, removing a layer of photoresist and sequentially laminating a dielectric layer and a metal plate on the copper plate, etching the copper plate, applying a layer of solder resist on a predetermined area where the copper plate has just been etched, defining a cavity opening by punching, routing or etching the laminate in a middle portion for attaching a die, attaching a heat sink over an upper surface of the laminate, forming a dam ring on the substrate and protecting the laminate by using a side mold to form a layer of mold compound surrounding the borders thereof, attaching a die and bounding gold wires and then encapsulating, and attaching solder balls on ball pads, thereby producing a packaging substrate with all aforesaid advantages.

BRIEF DESCRIPTION OF THE DRAWINGS

The above objective, other features and advantages of the present invention will become more apparent by describing in detail a preferred embodiment thereof with reference to the attached drawings, in which:

FIGS. 1A through 1I are schematic illustrations of forming steps of the TF-BGA method in accordance with the present invention;

DETAILED DESCRIPTION OF THE PREFERRED EMBODIMENT

Figure 2:
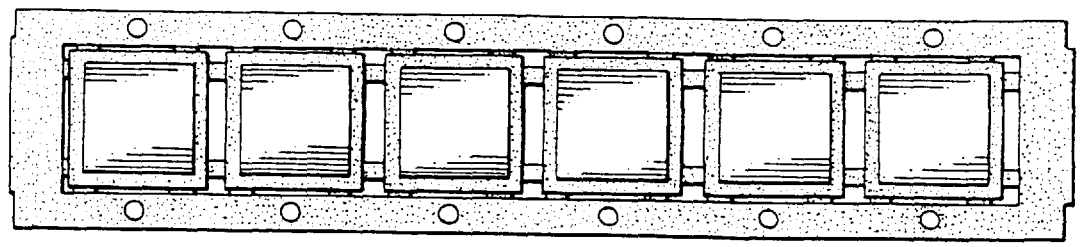
FIG. 2 is a top view of a long strip of substrate set formed by a plurality of individual substrate units in accordance with the present invention.
Figure 3A:
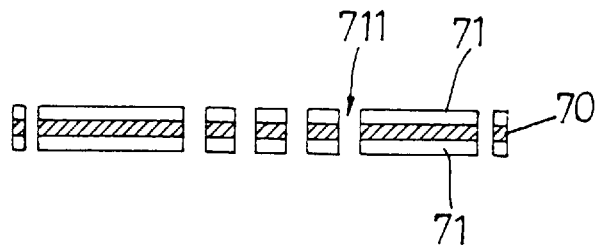
FIGS. 3A through 3H are schematic illustrations of steps of the conventional BGA method for manufacturing a packaging substrate.
Figure 3B:
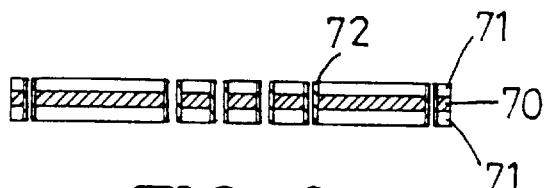
Figure 3D:
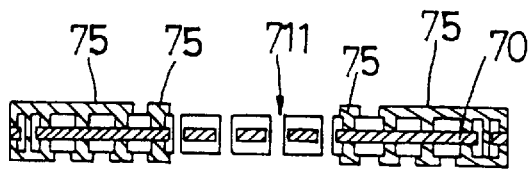
Figure 3C:
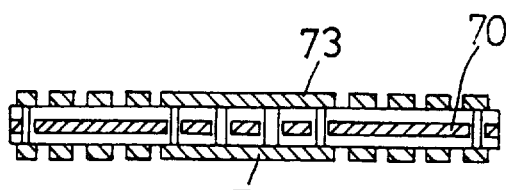
Figure 3E:
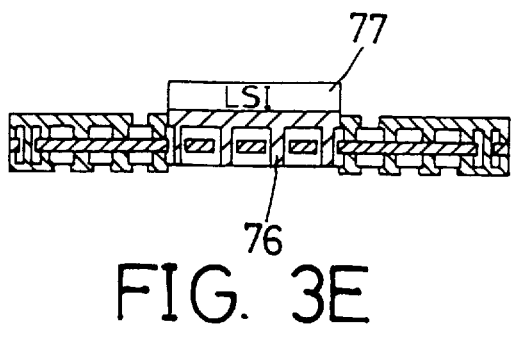
Figure 3F:
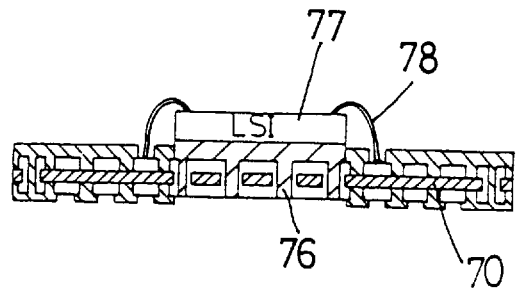
Figure 3G:
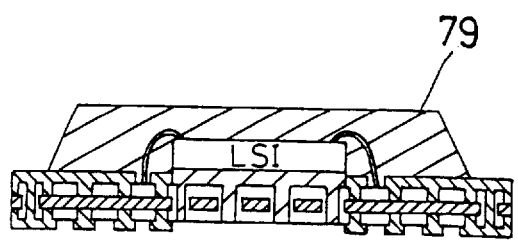
Figure 3H:
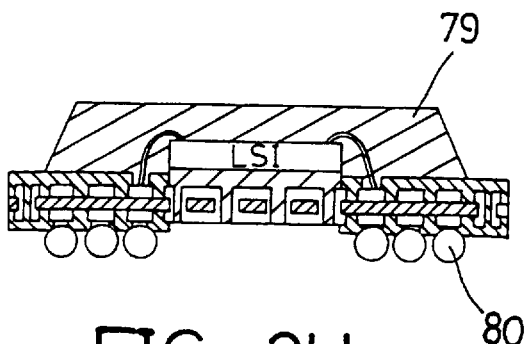

Referring to FIGS. 1A through 1I, a TF-BGA method for sequentially manufacturing a packaging substrate is described as follows. First, in a step of forming a single-sided circuit on a copper plate by electroplating, as shown in FIG. 1A, after a layer of photoresist 11 has been selectively laid on a copper plate 10, a non-covered portion of the copper plate 10 sequentially undergoes an electroplating process to form an electroplated circuit pattern layer 12 including various fine circuit patterns protruding upwardly, that is, the electroplated circuit pattern layer 12 sequentially undergoes different electroplating baths including Gold, Nickel, Copper and Tin to form a combined circuit pattern layer, thereby forming a single-sided circuit pattern on the copper plate 10. The TF-BGA method can achieve a more stable circuit line quality and obtain a finer linewidth as compared with a conventional BGA method for forming the circuit pattern by etching. Next, in a step of removing the photoresist layer and sequentially laminating a dielectric layer and a metal plate on the copper plate, as shown in FIG. 1B, after the photoresist layer 11 described above has been removed from the copper plate 10, a dielectric layer (may be a resin material) 20 and a metal plate 30 is laminated on the copper plate 10 in sequence. Then, as shown in FIG. 1C, the above-mentioned copper plate 10 is removed by way of etching. Subsequently, as shown in FIG. 1D, a layer of solder resist 35 is applied on a predetermined area where the copper plate 10 has just been removed by the aforementioned etching step and then ball pads and wire bonding pads are exposed. Thereafter, in a step of cavity opening-defining, as shown in FIG. 1E, a cavity opening 31 is defined by punching, routing or etching the laminate to form a space for attaching a die 40. Then, in a step of attaching a heat sink to the laminate, as shown in FIG. 1F, a heat sink 32 with a suitable thickness is laminated on or adhered to an upper surface of the laminate. Then, in a step of forming dam rings 34 on the laminate, as shown in FIG. 1G, and protecting the laminate by using a side mold to form a layer of mold compound 33 surrounding the border thereof. After that, in a step of attaching a die to the cavity opening and bonding the gold wires and encapsulating the cavity opening, as shown in FIG. 1H, the cavity opening 31 is encapsulated by encapsulate 50 after the die 40 has been attached to the cavity opening 31 and the gold wires 41 have been bonded between wire bonding pads and the die pads. At this point, the dam rings 34 have a function of preventing the encapsulate 50 from permeating outwardly. Finally, in a step of attaching solder balls, as shown in FIG. 1I, after solder balls 60 are soldered on the ball pads which seat on a bottom surface of the substrate, then the device assembly is completed and a packaging is thusly formed.

The packaging substrate is formed in such a way which is not the same as that in a conventional way of being directly formed in a long strip type as shown in FIG. 2. After each individual packaging substrate unit has been confirmed to be good of quality, they are molded together by using the molding technique, as shown in FIG. 2, and the borders thereof are linked in a latitudinal extension shape. Therefore, each substrate unit in the long strip of substrate set is assured to be good and thus scraping the entire strip of substrate set just for some substrate units in the long strip form being defective will not occur.

After the metal plate 30 is laminated on the copper plate 10, the dielectric layer 20 is the only material separating the metal plate 30 and the electroplated circuit pattern layer 12. Accordingly, when this metal plate 30 serves as a grounding layer, in addition to improving the electrical performance and promoting the heat dissipation efficiency of the substrate, the cost can be reduced through replacing the expensive resin by the metal plate 30. The way of forming the cavity opening 31 with the dam rings 34 in advance, as shown in FIG. 1G, needs the encapsulation only without the need to provide a mold tool for device assembly, and then the assembly process is more flexible than that in the conventional BGA method.

The TF-BGA method for manufacturing packaging in a long strip type described above has the following advantages.

(1) The TF-BGA method is simpler than the conventional BGA method. The present invention forms a circuit on one side of the substrate only without having problems of complicated drilling and the via holes-filling process.

(2) Since the circuit in the present invention is formed by electroplating, comparing with the conventional etching process, a high-density circuitry can be achieved, linewidth can be easily controlled and line shape can be well formed.

(3) The substrate achieves a better heat dissipation efficiency due to the die directly contacting both the metal plate and the heat sink which is attached on the upper surface of the substrate.

(4) The metal plate serves as a grounding layer to improve the electrical performance and to solve a problem of difficulty in adding an extra grounding layer in the conventional double-sided substrate.

(5) The costly resin is replaced by the metal plate, which greatly reduces the cost due to minimizing the resin usage.

(6) A long strip of substrate set without having any defective substrate unit therein eliminates the problem in device assembly and solves the problem of scraping the entire strip of substrate set just because some substrate units in the long strip form are defective.

(7) Molding individual substrate unit together to form a long strip type substrate set is suitable for a conventional operation in an assembly workshop.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A transfer flat type ball grid array method for manufacturing a packaging substrate comprising:

a step of electroplating a single-sided circuit for forming an upwardly protruding electroplated circuit pattern layer on a copper plate by way of selectively applying a layer of photoresist and then electroplating said copper plate;

a step of removing said photoresist layer and sequentially laminating a dielectric layer and a metal plate on said copper plate;

a step of etching for removing said copper plate on a bottom side of a laminate to expose said electroplated circuit pattern layer previously formed;

a step of selectively applying a layer of solder resist over an area on said electroplated circuit pattern layer being exposed;

a step of cavity opening-defining for defining a space for attaching a die in the center portion of said laminate;

a step of attaching a heat sink on an upper surface of said laminate;

a step of forming dam rings on said laminate and protecting said laminate by using a side mold to form a layer of mold compound surrounding the borders thereof;

a step of attaching a die to said cavity opening and bonding gold wires between the die pads and the wire bonding pads and then said cavity opening is encapsulated by encapsulate; and a step of attaching solder balls by soldering on the bottom portion of said laminate.

2. A method as claimed in claim 1, wherein each packaging substrate unit is made to link with other packaging substrate units in a long strip form by molding the boundary portions thereof after having been tested and found satisfactory to requirements.

3. A method as claimed in claim 1, wherein said cavity opening defining step is substantially a step of punching.

4. A method as claimed in claim 1, wherein said cavity opening defining step is substantially a step of routing.

5. A method as claimed in claim 1, wherein said cavity opening defining step is substantially a step of etching.

6. A method as claimed in claim 1, wherein said electroplated circuit pattern layer is formed by superimposing layers of Gold, Nickel, Copper and Tin.

7. A method as claimed in claim 1, wherein said dielectric layer is made of resin material.

* * * * *